United States Patent [19]

Forrest

[11] Patent Number: 4,876,209

[45] Date of Patent: Oct. 24, 1989

[54] METHOD OF MAKING AVALANCHE PHOTODIODE

[75] Inventor: Stephen R. Forrest, Torrance, Calif.

[73] Assignee: U.S.C., Los Angeles, Calif.

[21] Appl. No.: 351,063

[22] Filed: May 12, 1989

Related U.S. Application Data

[62] Division of Ser. No. 141,320, Jan. 6, 1987, Pat. No. 4,857,982.

[51] Int. Cl.$^4$ ............................................. H01L 21/76
[52] U.S. Cl. ............................................. 437/5; 437/3; 437/74; 437/75; 357/13; 357/16; 357/29; 357/30; 148/DIG. 70
[58] Field of Search ................... 357/13, 16, 30 A; 148/DIG. 70; 437/3, 5, 74, 75

[56] References Cited

U.S. PATENT DOCUMENTS

| | | | |
|---|---|---|---|
| 4,212,019 | 7/1980 | Watage | 357/13 |
| 4,396,443 | 8/1983 | Lewerenz | 437/5 |
| 4,455,351 | 6/1984 | Camblibel | 437/5 |
| 4,586,067 | 4/1986 | Webb | 357/13 |
| 4,587,544 | 5/1986 | Webb | 357/13 |
| 4,597,004 | 6/1986 | Lougeway | 357/13 |
| 4,631,566 | 12/1986 | Campbell | 357/13 |
| 4,651,187 | 3/1987 | Sugimoto | 357/16 |
| 4,656,494 | 4/1987 | Kobayashi | 357/16 |
| 4,684,969 | 8/1987 | Taguchi | 357/13 |
| 4,700,209 | 10/1987 | Webb | 357/13 |
| 4,701,773 | 10/1987 | Kanada | 357/13 |
| 4,729,004 | 3/1988 | Sakai | 357/13 |
| 4,731,641 | 3/1988 | Matsushima | 357/16 |
| 4,755,860 | 7/1988 | Allan | 357/13 |
| 4,761,383 | 8/1988 | Matsushima | 357/13 |
| 4,790,819 | 4/1988 | Ouchi | 357/13 |
| 4,816,890 | 3/1989 | Ouchi | 357/13 |

FOREIGN PATENT DOCUMENTS 054080 5/1981 Japan.
012087 1/1986 Japan.

OTHER PUBLICATIONS

"Laser Lights the Way", Electronics, Feb. 24, 1986, pp. 19-20.
Stillman, G. E., Wolfe, C. M., Rossi, J. A., Ryan, J. L., "GaAs Electro Absorption Avalanche Photodiode Detectors", Inst. Phys. Conf. Ser. No. 24, 1973 Chapter 4, pp. 210-222.
Law, H. D., Tomasetta, L. R., Nakano, K., "Ion-Implanted in GaAsP Avalanche Photodiode," Appl. Phys. Lett. 33 (11), 1978.
Diadiuk, Y., Groves, S. H., Hurwitz, C. E., Iseler, G. W. "Low Dark-Current, High Gain GaInAs/InP Avalanche Photodetectors", IEEE J. of Quantum Electronics, vol. QE-17, No. 2, Feb. 1981.
Susa, N., Nakagome, H., Ando, H., Kanbe, H. "Characteristics in InGaAs/InP Avalanche Photodiodes with Separated Absorption and Multiplication Regions", IEEE J. of Quantum Electronics, vol. QE-17, No. 2, Feb. 1981.

Primary Examiner—Brian E. Hearn
Assistant Examiner—Anthony Gutierrez
Attorney, Agent, or Firm—Poms, Smith, Lande & Rose

[57] ABSTRACT

The disclosed invention as directed to a semiconductor material avalanche photodiode of a separate multiplication and absorption region heterostructure design (SAM-APD). The improved SAM-APD of this invention is characterized by a plurality of floating guard rings which are separated about a central region and doped in the opposite high concentration from that of the multiplication region in which they are positioned. These rings float in the sense that they have no contact with the metalized p-contact of the photodiode; and, therefore, no direct contact with the current source. This structure results in an enhanced avalanche effect in the central region with limited edge breakdown undesirable consequences. In addition to this structure, an alternative embodiment suggest the use of both a floating ring and thin slab below the central region, of a dimension slightly smaller than the smaller region and concentric with it to achieve an optimized central avalanche breakdown with reduced edge breakdown of the electric fields formed during reversed biasing of the APD (avalanche photodiode).

3 Claims, 8 Drawing Sheets

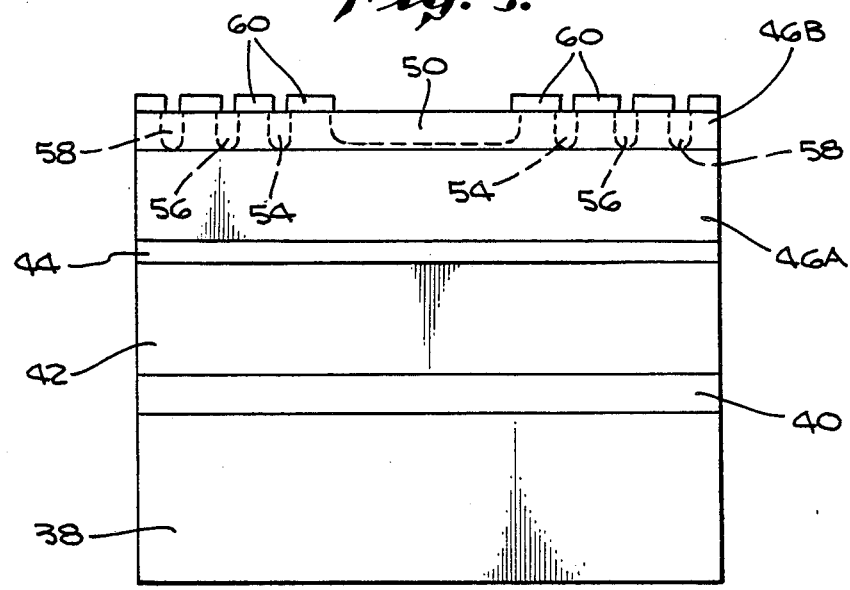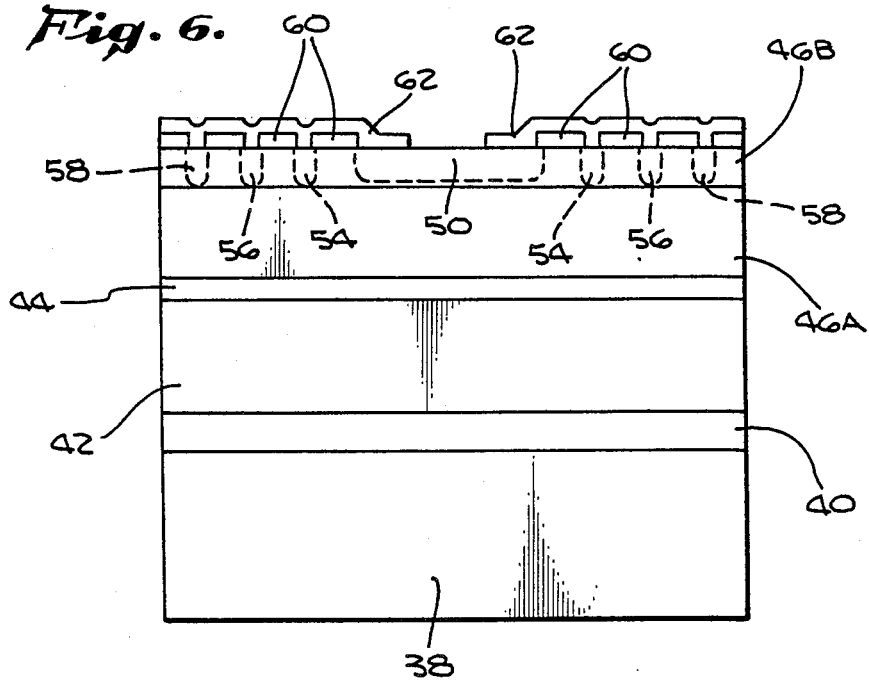

METHOD OF MAKING AVALANCHE PHOTODIODE

This is a divisional of co-pending application Ser. No. 07/141,320 filed on Jan. 6, 1988. Now U.S. Pat. No. 4,857,982

FIELD OF THE INVENTION

This invention relates to avalanche photodiodes, and more particularly, to improved heterostructure avalanche photodiodes having separate absorption and multiplication regions for application to long wavelength optical communication.

BACKGROUND OF THE INVENTION

Fiber optics has gained prominence in telecommunications, instrumentation, cable T.V., network, and data transmission and distribution. Major application of fiber optics has been in the area of telecommunications. Over the last decade there has been a significant change-over from wires and co-axial cables to optical fibers for telecommunication systems and information services. This anticipated change is dictated by the benefits of improved technology as well as economics. Increasing cost and demand for high data rate or large bandwidth per transmission channels and the lack of available space in already congested conduits in every metropolitan area are a key reason in the change over from the wires to fiber optics. Additionally, fiber optical devices interface well with digital data processing equipment, and their technology is compatible with modern microelectronic technology.

A key component of the modern optical fiber system is the photodetector. The function of the detector in a fiber optic communication link is to convert optical power into electrical response. The most common detector used in fiber applications is the photodiode, which acts as a converter of optical power to electrical current. The type of semiconductor photodiode commonly used for fiber optics application has a reverse bias p-n junction.

The two most commonly used photodetectors heretofore are the p-i-n photodiode (p/intrinsic/n type conductivity) and the avalanche photodiode (APD). Both types of photodiodes are instantaneous photon-to-electron converters where absorbed photons generate hole-electron pairs to produce an electric current. The p-i-n (or pin) and avalanche photodiodes are actually modified p-n junction devices with additional layers at differing doping levels to produce either more efficient quantum conversion or avalanche gain through ionization. Basically, a photon is absorbed in a relatively high E (electric) field region, where an electron-hole pair is created. This will produce current in the detector circuit. To obtain high quantum efficiency, the pin photodiode provides absorption in a relatively highly resistive central intrinsic region.

An alternative approach to the pin photodiode is one in which higher detector currents are created as a result of the avalanche gain effect, as in the case of the avalanche photodiode (APD). In this case, a single electron-hole-pair may generate hundreds of secondary electron-hole-pairs. Because these events occur at random and are of a statistical nature, the noise generated in these devices can be a limiting factor on detectivity. In designing a solid state photodiode, there is a tradeoff between quantum efficiency and the speed of response.

For high quantum efficiency, the width of the intrinsic region of a pin device, for example, should be comparable to two or three times the absorption length of light in the material being used. For high speed response, the device should be as thin as possible to minimize carrier transit times. Silicon detectors operating at wavelengths below 0.9 micrometers are capable of both high quantum efficiency (in excess of 50%) and fast response (less than 0.5 nanoseconds (ns)). At longer wavelengths, however, the absorption length in silicon rapidly increases, and other materials must be used in the manufacture of a photodiode.

Recently, a most successful device capable of achieving high sensitivity at a longer wavelength (between 0.9–1.65 micrometers) has been an APD having separate absorption and multiplication regions, known as a SAM-APD (separate absorption and multiplication-avalanche photodiode). This device was first successfully demonstrated using InGaAs/InP (indium-galium-arsenide/indium phosphide) heterostructures sensitive towavelengths as long as 1.65 micrometers in a mesa geometry in 1981.

Unfortunately, mesa APDs have proven to be unreliable for use in practical systems applications, and it has become necessary to investigate the possible planar geometry structures which might be compatible with the requirements of the SAM-APD device. The basic design concept of the SAM-APD is that the electric field in the wide band gap InP multiplication region be large enough to induce carrier multiplication (and therefore photo current gain) while the field in the InGaAs absorbing region be low enough so that no tunnelling leakage currents are induced. These limits place stringent requirements on the epitaxial material layer thickness and dopings, particularly for the InP layer. In fact, the tolerances for these parameters are so tight, that normal planar geometries containing guard rings at the edges of the P-N junction which act to eliminate catastrophic edge breakdown effects are difficult to employ. Examples of such planar geometry attempts at producing heterojunction avalanche photodiodes include U.S. Pat. Nos. 4,651,187 (dated Mar. 17, 1987 to Sugimoto) and U.S. Pat. No. 4,684,969 (dated Aug. 4, 1987 to Taguchi).

Successful planar structures have been demonstrated which avoid the guard ring problem by utilizing highly complex regrowth structure. One such example may be found in U.S. Pat. No. 4,656,494 to Kobayashi (Apr. 7, 1987). Kobayashi discloses a buried structure avalanche multiplication photodiode having a surface level between the multiplication region and the guard ring region. Essentially, the structure disclosed in Kobayashi consists of absorption layers followed by the multiplication region. Next, annular areas which will eventually contain the guard rings are etched away leaving a groove, such as groove 31 of FIG. 6(a) of Kobayashi which penetrates deep into the absorbing region. A low concentration end conductivity type layer 4 is selectively grown on the surface of the removed portion of the n-InP layer 3, shown in FIG. 5(e). The resulting structure has a flat parallel surface to the absorbing layer 2. This structure is complex to fabricate and may result in a potentially highly defected regrowth interface in the highest electric field regions of the device. Large leakage currents may result from such a structure except when material growth and fabrication conditions are held under the tightest possible control. Such devices are currently available in limited quantities and at a high price.

Another example of an avalanche photodiode which seeks to improve performance by preventing edge breakdown and the multiplication of the surface leakage currents in the junction periphery is U.S. Pat. No. 4,700,209 issued to Webb (Oct. 13, 1987). The Webb patent introduces a central zone 32a which has n-type conductivity and contains an excess areal concentration of conductivity modifiers above the background concentration. The central zone 32a is always of lesser extent than the cap region 36. The central zone is spaced apart from the absorption and cap regions where active multiplication occurs.

By enhancing the activity within the central multiplication region of the avalanche photodiode, while preventing edge breakdown, an optical fiber system may be designed having large repeater spacing for large capacity data transmission. This factor alone would bring a substantial system cost reduction. When future systems with improved avalanche photodiodes can be built operating in the region of 1.2 to 1.6 micrometers, a marked increase in repeater spacing is expected. Also a total fiber loss of 0.2 dB/km is achieved. Such results indicate that long wavelength APD detectors will allow a fiber optic system to achieve a repeater spacing greater than 60 km at 1 gigabit per second using a single mode fiber. Repeater spacing greater than 200 km may be achieved where the laser operates at 1.55 micrometers.

Therefore it is an object of this invention to provide a SAM-APD having high sensitivity and high reliability, but which is also easy to fabricate so that the final structure has low leakage currents with little tunneling or edge breakdown effects.

SUMMARY OF THE INVENTION

Disclosed herein is an avalanche photodiode, which comprises a substrate composed of a semiconductor material; a buffer region composed of the same first semiconductor material, the buffer being formed over the substrate. A ternary light-absorbing region is then formed over the buffer and is composed of a second semiconductor material which is doped with an impurity of a first conductivity type formed over the buffer region. A multiplication region is then formed over the absorbing region in the preferred embodiment and is composed of the first semiconductor material, doped with an impurity of the first conductivity type. The multiplication region forms a heterojunction with the light absorbing region and has its upper portion doped with a low concentration of an impurity of the first conductivity type.

The avalanche photodiode of this invention has a central region composed of the first semiconductor material, which is doped to a high concentration with an impurity of a second conductivity type. The central region is implanted or diffused onto the multiplication region. At least one floating ring region, composed of the first semiconductor material, is doped to the same high concentration as the central region with an impurity of the same second conducting type. The term "floating ring" as used in this application, refers to a doped region which has no physical contact or connection with an external current or voltage biasing source. The floating ring region is concentrically circling the central region at the top surface of the photodiode. This ring region has no direct contact to a source of electrical potential. In this manner, the floating ring region acts as a guard ring to prevent breakdown at the junction edge of the photodiode, thereby enhancing the gain and efficiency of the photodiode in the central region and away from the edges of the photodiode. The floating ring region may comprise a plurality of rings each of which encircles one another in the central region.

In addition to the floating ring region structure, the gain in efficiency of the photodiode may be enhanced by use of a thin slab region composed of the same first semiconductor material which is doped to a high concentration with an impurity of a second conductivity type. This slab region is juxtaposed between the central region and the multiplication region. Use of such a thin slab enhances the avalanche multiplication effect in the central region while reducing edge breakdown substantially.

The improved SAM-APD of this invention may alternatively include a speed-up region which is positioned between the multiplication region and the absorption region and composed of a third semiconductor material. This speed-up region is comprised of a material whose bandgap is midway between that of the first and second materials. The speed-up region enhances device response at high frequency by facilitating the flow of the carriers to the multiplication region. In order to operate efficiently, the avalanche photodiode of this invention should have at least two protective layers covering the top surface of the photodiode and surrounding the central region.

A method of manufacturing the avalanche photodiode of this invention comprises the steps of epitaxially depositing the buffer region over the substrate. Both the buffer and substrate are of a first semiconductor material. A ternary absorption region of a second semiconductor material is epitaxially deposited over the buffer region and doped with an impurity of the first conductivity type. A multiplication region may then be deposited on the absorption region. The multiplication region is of a first semiconductor material and doped with an impurity of the first conductivity type, except, at its upper surface where the multiplication region is doped with a low concentration of an impurity of the first conductivity type.

A first diffusion barrier film (such as silicon nitride or silicon dioxide) is then deposited over the multiplication region defining by photolithography a diffusion window using photo-resist. The multiplication region is then doped and diffused in its upper surface with an impurity of a second conductivity type in a central region of the upper surface of the multiplication region. A plurality of concentric rings are then diffused and doped in the upper surface of the multiplication region surrounding the central region. These rings are composed of the same material and conductivity type as the central region. Alternatively, the rings can be diffused concurrently with the central region diffusion. After the rings are deposited in circling the central region, a second film over the first barrier film is deposited with the purpose of protecting the upper surface of the multiplication region.

A metal alloy is then thermally deposited as a conductivity contact for the central region. The contact is not directly connected to the concentric rings; therefore, the concentric rings are allowed to float with respect to the central region potential. In this manner an avalanche photodiode is completed which has reduced edge junction breakdown, which enhances the noise performance of the photodiode.

The disclosed method of manufacturing may also include the step of epitaxially depositing a speed up region of a third semi-conductive type of intermediate bandgap over the absorption region before the multiplication region is deposited.

Additionally a thin slab region may be ion implanted or grown into the avalanche photodiode. This thin slab region is composed of the first semiconductor material doped to a high concentration with an impurity of a second conductivity type, and sits between the sensor region and the multiplication region. In this manner additional enhancement of the gain in the central region may be achieved by the photodiode.

In summary, the avalanche photodiode of this invention has a plurality of functional regions each layered one on another over a substrate. The upper most layer is a multiplication region and made from a first semiconductive material doped with an impurity of a first conductivity type. A central region is doped with an impurity of a second conductivity type. The central region is then surrounded by at least one guard ring of the same material and conductivity type as the central region. The guard ring does not contact any source of electric current. In this manner the photodiode has an avalanche effect that is substantially confined to the central region. Any breakdown occurring at the edge or periphery of the avalanche photodiode is substantially reduced.

In addition to the floating rings, a thin slab region of the first semiconductor material, which is doped with a high concentration of impurity of the first conductivity type, is then ion implanted below the central region. In this manner the avalanche effect is further enhanced in the central region.

BRIEF DESCRIPTION OF THE DRAWINGS

FIG. 5 shows a cross-sectional view of the second phase of manufacture wherein p-n junction formation and a protective coating is placed at the upper surface of the photodiode.

FIG. 6 shows further building and structure wherein the second protective coating 62 covers the upper surface after ion implantation of the central region 50 and the rings 54, 56, and 58 has occurred.

DETAILED DESCRIPTION OF THE PREFERRED EMBODIMENT

Figure 1:
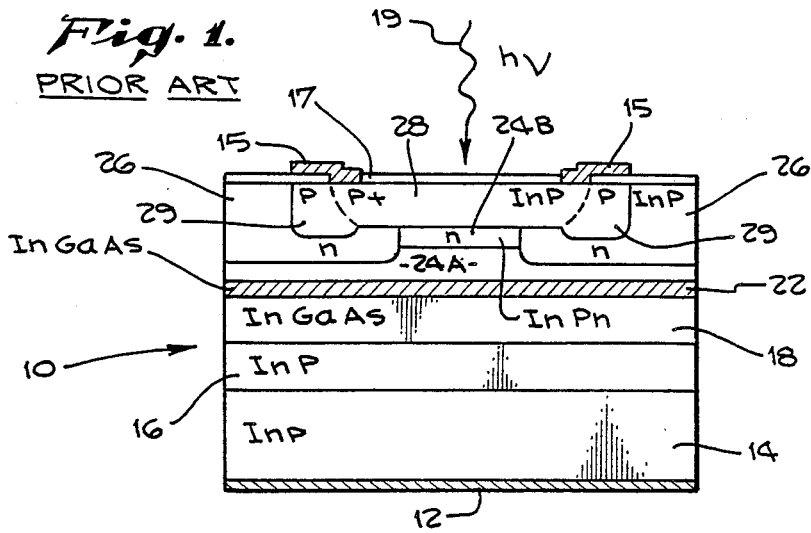
FIG. 1 is a cross-sectional view of a prior art embodiment of an avalanche photodiode, having a mesa structure topped off by regrowth planar geometry.

FIG. 1 shows a planar structure demonstrated in the prior art which avoids the use of standard large guard rings to prevent edge breakdown by using a highly complex regrowth structure for the photodiode 10, shown generally. This complex planar structure in the prior art consists of a substrate such as InP (indium phosphide) having a high concentration of impurities which doped the substrate preferably to make it an n+ type conductivity. Coating the underside of the substrate is a metalised n-contact 12. Above the substrate 14 is the usual growth of n-InGaAs (indium galium arsenide) layer 18, which is seated above a buffer region 16 of an indium phosphide material. The absorbing region 18 may be coated with the speed up region 22 made from indium galium arsenide phosphide (InGaAsP). The speed up region helps to sweep away electrons from the absorption region 24A and 24B, but is not required for low frequency operation of the photodiode 10 of FIG. 1.

It will be noted that a mesa-like configuration is etched away from either side of the regions 24A and 24B. The annular area, which is to contain the guard rings 26, is etched away, leaving a groove penetrating nearly into the absorption region 18. The structure is placed back in a growth reactor, where n-concentration or n-InP (indium phosphide) is regrown to fill the grooves resulting from the mesa etching. A two step diffusion of acceptors is conducted to form the p-n junction with large radius guard ring lobes 26 extending into the regrown region.

The central region 28 may be made from a p+ conductivity indium phosphide diffusion, where the periphery section 29, on either side of central region 28 may be doped to a "p" concentration of acceptors. An antireflective coating 17 covers the top of the central region 28 where diffusion occurred. This top coating may also comprise an oxide layer deposited for passivation of the component. A p-type annular contact 15 is placed above the central region 28 and its annular lobes 29.

While the foregoing planar structure is successfully demonstrated in the prior art, it is extremely complex to fabricate and has a potentially highly defective regrowth interface in the highest electric field regions of the invention. This is expected to result in a large leakage current except only where the material growth and fabrication conditions are held under the tightest possible controls. Photodiode devices manufactured like this are only available in limited quantities and at a high price. Until the invention disclosed by the applicant, competitive planar structures to that shown in FIG. 1 have been unworkable or of critically high tolerance design characteristics which were largely unattainable.

Figure 2:
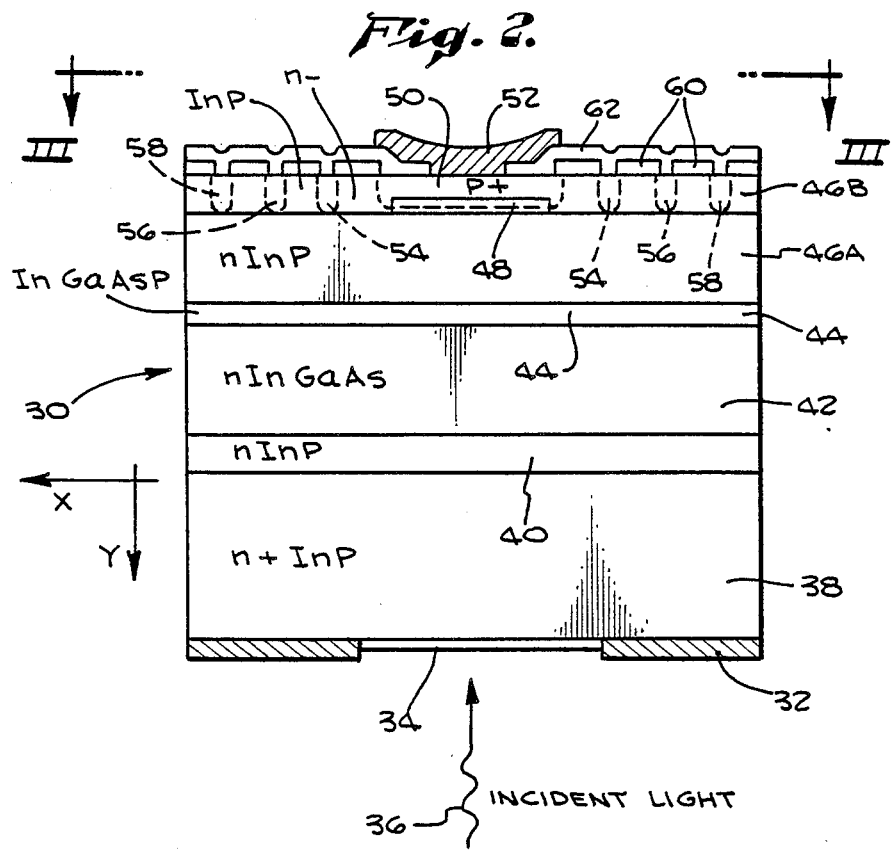
FIG. 2 is a cross-sectional view of a preferred embodiment of the avalanche photodiode of this invention, showing the heterostructure of the device having a plurality of planar layers grown one on top of another with guard rings used to enhance the avalanche effect at the heterojunction between the central region 50 and the multiplication region 46a. As an alternative embodiment, FIG. 2 also shows the use of a thin slab 48 to enhance the avalanche effect in the central region 50.

FIG. 2 shows the new and simplified planar SAM-APD structure of this invention, as photodiode 30 of FIG. 2. This structure avoids the necessity for, and problems inherent in, regrown large radius guard rings to prevent edge breakdown. The structure of this invention has a substrate 38 made from InP (indium phosphide) with impurities and dopant added to make the substrate, a highly concentrated n+ conductivity type region. An n-contact 32 is annularly secured below the substrate 38, while an anti-reflective coating 34 provides a window into which incident light 38 may enter the photodiode. A buffer region 40 (n-type InP) is provided to prevent the migration of carriers from the substrate into the absorbing region 42.

The ternary absorbing region 42 is manufactured from n-conductivity type InGaAs (indium galium arsenide).

Upon the absorption region 42 may be a speed-up region 44 made from a semiconductor InGaAsP (Indium-Galium-Arsenide-Phosphide). Above the speed-up layer 44, or directly above the ternary absorption region 42, is the main multiplication region 46A. The multiplication region 46A is an n-conductivity type InP multiplication region doped with a high concentration of donors. A central region 50 of the photodiode 30 of this invention has a p-type contact 52 seated above the central region 50.

In an alternative embodiment, a slab 48, is made from highly doped n+ conductivity Indium Phosphide. This slab is very thin and embedded at the under side of the central region 50. In the preferred embodiment, the slab thickness is in the range of 1000–5000 Angstroms (1 $A = 10^{-10}$ m). The effect of the slab is to cause a rapid increase of the E-field in the central p-n junction, while leaving the curved edges of the junction unaffected. Hence, breakdown voltage in the central region is lowered to a value below that of the curved edge, eliminating edge breakdown.

Large radius guard rings known to be used in the prior art to prevent edge breakdown may be eliminated. Instead, the rings of this invention comprise one or more guard rings, as shown at 54, 56, and 58, respectively. Rings 54, 56, and 58 are floating and manufactured of the same material and doped to the same extent as the central region 50; i.e., high concentration p type conductivity impurities (p+). The rings are "floating" since no direct current contact is made to them. It is noted that metal p-contact 52 does not directly engage any of the rings 54, 56 or 58, even though the metal contact 52 does contact the central region 50.

A first diffusion barrier film 60 covers the upper surface of the multiplication region 46B to allow p-type doping of the central region 50 and the rings 54, 56 and 58. It will be noted that the upper portion of the multiplication region 46B has doping characteristics distinct from that in 46A. The multiplication region 46A is doped to an n concentration (to a free carrier concentration in the range of $10^{15}/cm^3$), while the multiplication region 46A is doped to a concentration $1-8 \times 10^{16}/cm^3$ (n-type conductivity).

The doping and thickness of the multiplication region is adjusted to obtain a peak field of greater than $4.5 \times 10^5$ volts/cm, while the field at the interface between the multiplication region 46A and the absorption region 42 (where there is no speed-up region for 44) can exceed the tunneling field value. After the floating guard rings have been diffused into the upper portion of the multiplication region 46B, a second deposition of a film 62 may be accomplished.

Figure 3:
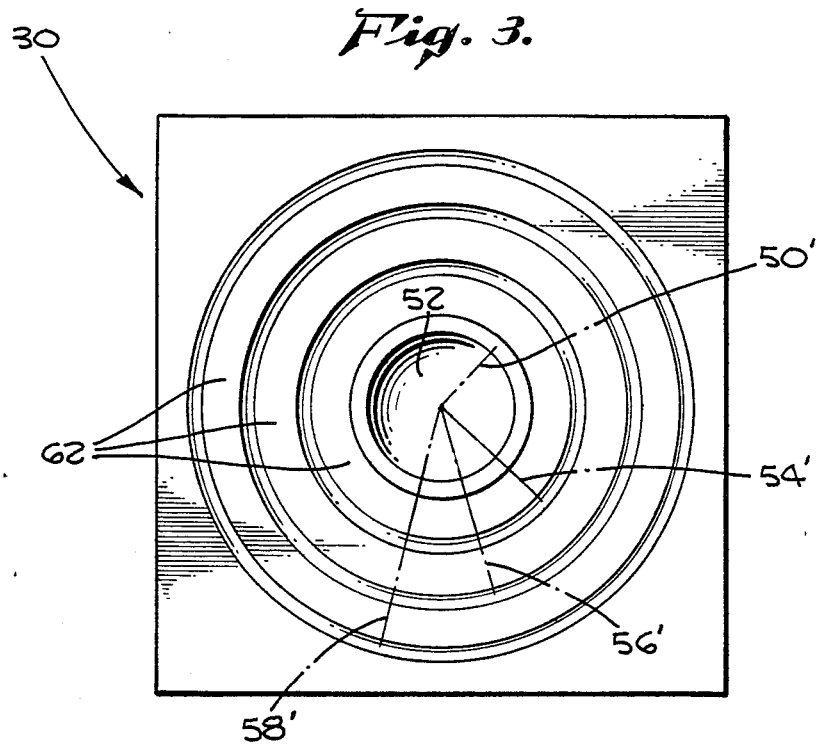
FIG. 3 shows a top view of the configuration of the concentric guard rings which encircle the central region of the photodiode of this invention, taken along line III—III of FIG. 2.

FIG. 3 shows a top view of the APD 30 of the preferred embodiment of this invention. The metal contact 52 is central to the photodiode 30. The region 50' shows the extent radially of the central region which is immediately below, but not necessarily in view, the metal contact 52. The protective layer 62 spreads across the top of the photodiode, divided by each of the rings, as indicated at a radius of 54', 56', and 58' respectively.

It will be noted, from viewing FIG. 3, that the floating rings are equally spaced and concentric with the central region which extends out to the radius 50'. However, the spacing need not be equal whereby rings closer to the center can be spaced more closely together than rings farther out.

Figure 4:
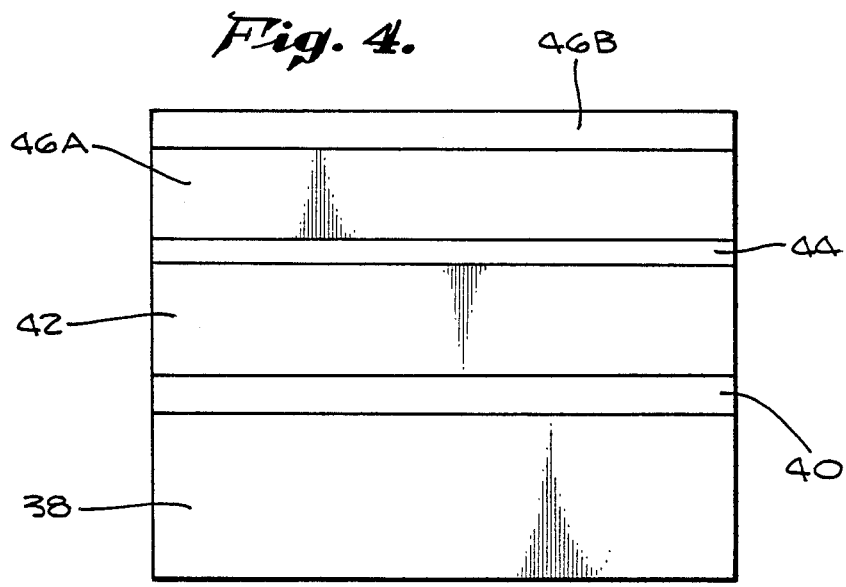
FIG. 4 shows the first step of expitaxial growth of the various layers of the heterostructure of the avalanche photodiode of this invention, as the diode is being manufactured.

FIGS. 4, 5, and 6 show the method, step by step of fabricating the planar configuration SAM-APD 30 of this invention. Each of the regions, including substrate 38, buffer region 40, absorption region 42, optionally, speed-up region 44, and the lower 46A and upper 46B multiplication region are epitaxially deposited by epitaxial growth techniques.

A first diffusion barrier film 60 is deposited in a plasma enhanced chemical vapor deposition unit. The diffusion barrier film is typically $SiN_x$, often $Si_3N_4$. This first barrier film deposit is typically 700 to 1500 A thick and has a refractive index in the range of 1.95–2.10. A diffusion window is photolithographically defined, the $Si_3N_4$ is removed by Freon plasma etching and the resist is stripped using an oxygen plasma. In the preferred embodiment, zinc diffusion is used to form the p-type conductivity regions. The resulting dopant diffusion creates the central region 50 and each of the respective guard rings, 54, 56, and 58.

After diffusion of the central region 50 and each of the guard rings 54, 56, and 58, a second $Si_3N_4$ deposition is done. This layer 62 (FIG. 6) is used for confining the p+ contact to a small region in the center of the diffusion window immediately above the central region 50 in order to thoroughly passivate the p-n junction. The completed structure containing the p-side contact 52 is shown at FIG. 2. The p contact is made by thermally depositing AuZn in alloy form and annealed at 420° C. Thermal deposition of AuSn layer on the back of the wafer provides an n contact 32 on the underside.

The forgoing description of fabrication does not include the speed-up layer 44 shown on FIG. 2 and FIG. 4. This layer 44 may be fabricated and incorporated as part of the overall APD 30 design.

Figure 7:
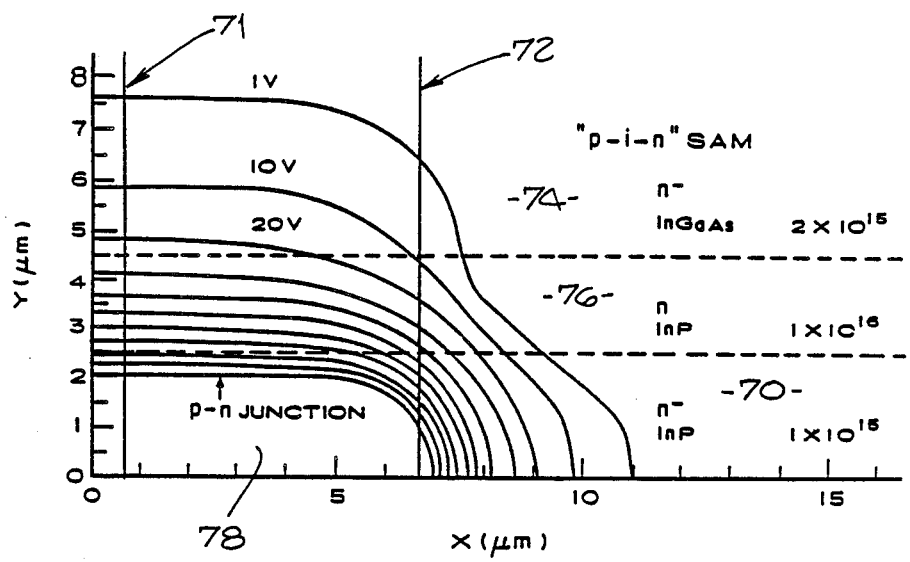
FIG. 7 is a prior art equipotential profile of a standard unguarded pin photodetector.
Figure 8:
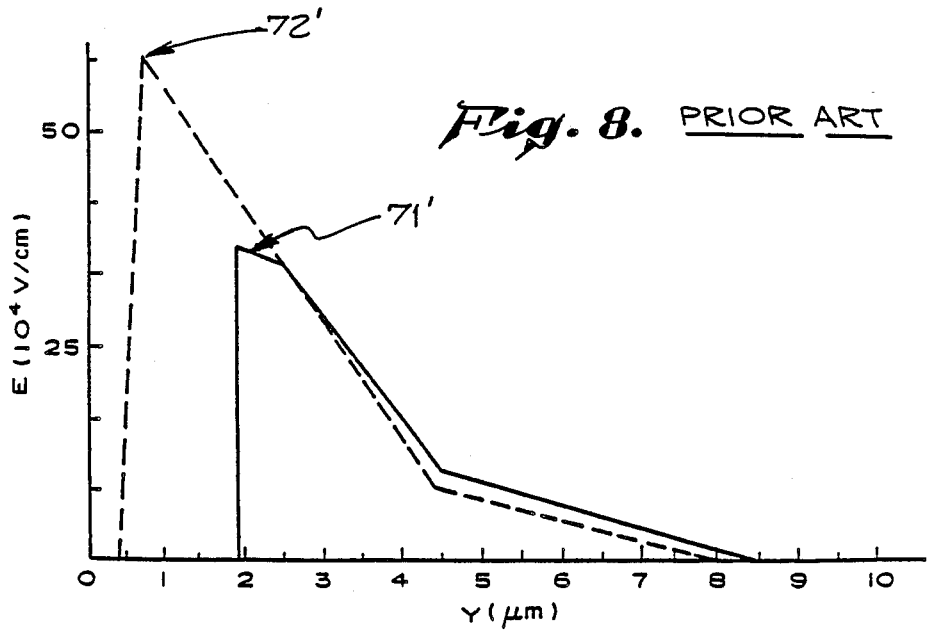
FIG. 8 is a prior art electric field distribution in the y-axis direction of the standard unguarded pin photodetector of FIG. 7.

FIG. 9–16 show the Electric fields and equipotential plots of fields produced by operational diodes at the surface and into the depth of the diode, compared and contrasted with prior art tests shown at FIGS. 7 and 8.

FIG. 7 shows a prior art equipotential profile of a standard unguarded p-i-n InGaAs photodetector. Multiplication upper region 70 and lower region 76 is shown in a heterostructure with an absorbing layer 74 of n-conductivity in the form of InGaAs material. The p-n junction is formed by the interface between the central region 78 of p doped InP material interfacing with the multiplication region of the p-i-n InGaAs photodetector. The graphic representation of FIG. 7 shows an extending radius on the x-axis outward from the center of the photodiode, while the y-axis is directed downward from the top of the diode into the central portion. Measurements of the equipotential profile field are made at central position 71 and perimeter position 72. As can be seen by reviewing FIG. 8, the electric field distribution of the standard unguarded p-i-n InGaAs photodetector shows an electric field 71' at the central region which has a lesser strength than the electric field 72' of the periphery of the device. The distance between equipotential lines on FIG. 7 is inversely proportional to the electric field along any given direction in the diode interior. Thus, the closer the line spacing, as shown on FIG. 7, the higher the electric field.

FIG. 8 of the prior art design shows the electric field as measured along each of the lines 71 and 72 drawn parallel to the y-axis in FIG. 7. It is clear from these FIGS. 7 and 8 that the unguarded structure has a significantly higher electric field at the junction edge than compared to the center, or flat part of the junction. This field concentration is the well-known source of localized, or edge breakdown in the p-i-n type structures, and as a result of the small radius of curvature at the p-n junction edge. Due to this effect, unguarded APDs are useless for low noise operation. From FIG. 8, it is apparent that the E-field at the junction edge is approximately 1.7 times greater than at the junction center.

Figure 9:
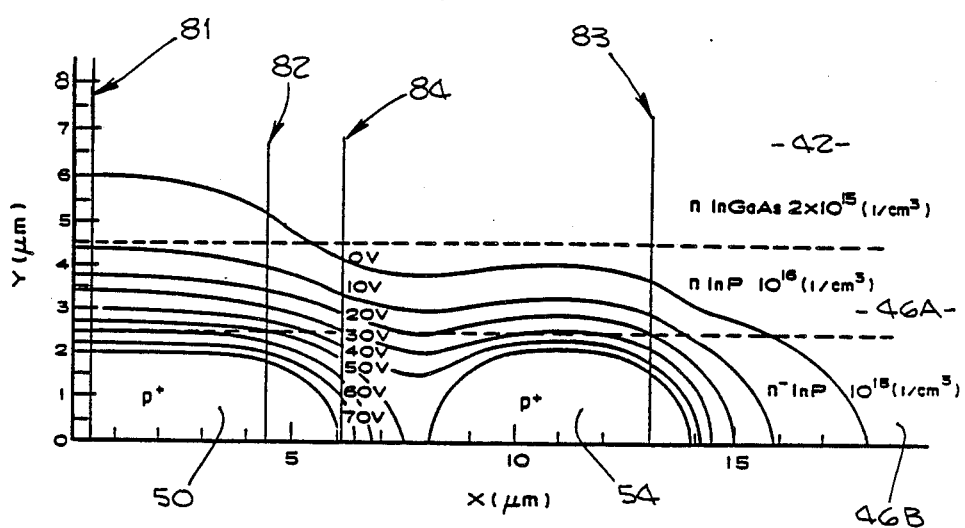
FIG. 9 shows an equipotential profile of an avalanche photodiode having a single floating guard ring.
Figure 10:
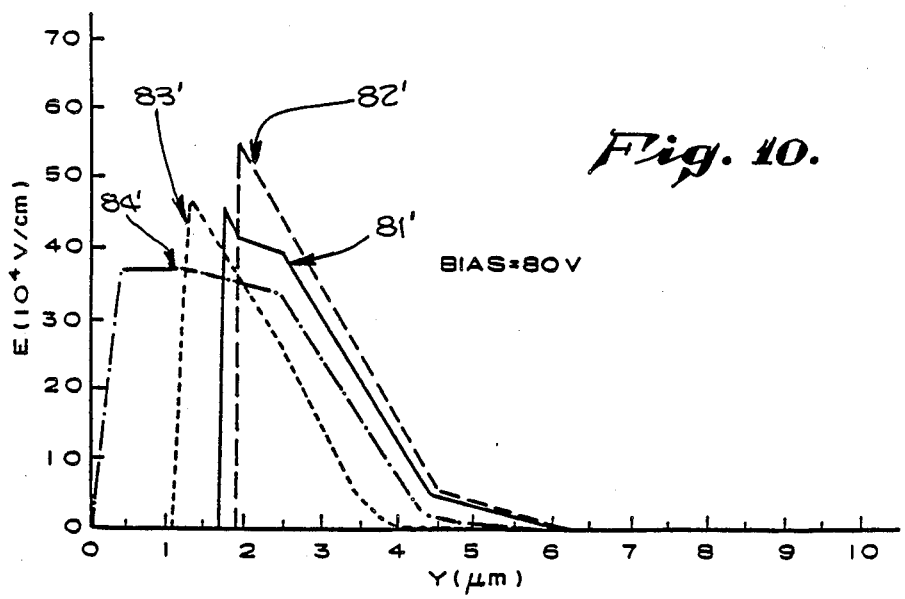
FIG. 10 shows the electric field potential of the avalanche photodiode shown in cross-section in FIG. 9, where the photodiode has a single floating guard ring.

In contrast to the prior art testing shown in computer simulated format of FIGS. 7 and 8, a computer calculated equipotential profile (subsequently verified by actual experimentation) is shown at FIG. 9 for the SAM-APD of this invention with a single floating guard ring 54. Although it is preferred that more than one guard ring be used, calculations may be derived and good results obtained from a single floating guard ring 54 as shown in FIG. 9. FIG. 9 shows that although the equipotentials are crowded at the outer edges of both a central p-n junction (or active junction) and the floating ring, the degree of this potential concentration is greatly reduced from that of the p-i-n diode. This fact is readily apparent from the field strength plot shown through computer simulation as in FIG. 10. Here, the edge field had been reduced to within a factor of 1.3 of the central field. Plots 81', 82', 83' and 84' each correspond to a reading of the field strength shown along the vertical axis selected at 81, 82, 84 and 83 at various locations along the radius axis of the APD of this invention.

It is important to note that a sizable reduction in edge field was accomplished using only a single floating ring. Since the preferred device has at least a double floating ring, it will more adequately guard the APD device. Furthermore, the floating ring structure has a fabrication process almost identical to the p-i-n device since the active p-n junction region and the rings are all formed in a single diffusion step. Unlike other guard ring methods, the total fixed charge in the n-InP gain region located out of the junction is a constant, independent of the lateral position, along the x-axis. Thus, the requirement of multiplication in the absence of tunneling is strictly adhered to, independent of lateral position. In general, this condition is not met in standard, large lobe guard rings used, for example, in the silicon APD technology. The floating rings greatly reduce the electric field at the semiconductor-insulator interface parallel to the x-axis. This will eliminate the possibility of surface breakdown along the typically "weak" interface, thereby enhancing the reliability and operation of the APD. Although the guarding is not complete in a single ring structure, a significant reduction in edge fields is comparable to that which is obtained in lobe ring devices.

Figure 11:
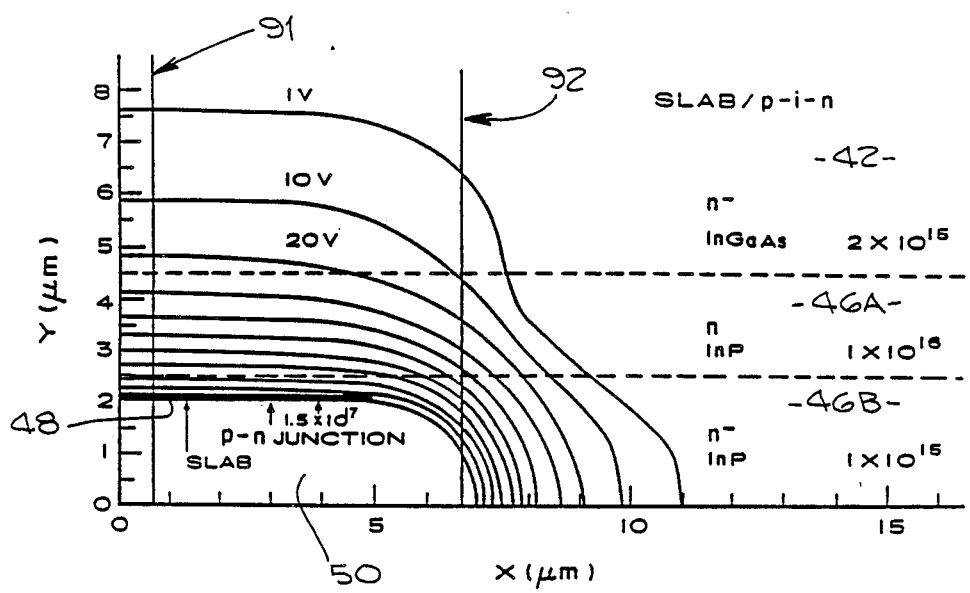
FIG. 11 shows an equipotential profile of the use of a slab region in the avalanche photodiode.

In order to strongly enhance breakdown in the central region 50, over the edge breakdown, one may use a slab-guarded APD. This structure, as shown in FIG. 11 consists of a standard p-i-n single diffused junction with an additional thin slab of highly doped n InP adjacent to the central region 50 of the diffused front. In simulation, the slab thickness is 1000 A, the doping ($0.5 \times 10^{17}/cm^3$) effect of the slab is to cause a rapid increase of the electric Field in the central p-region, while leaving the curved edges of the junction unaffected. Hence, the breakdown voltage in the central region is lowered, eliminating edge breakdown.

Figure 12:
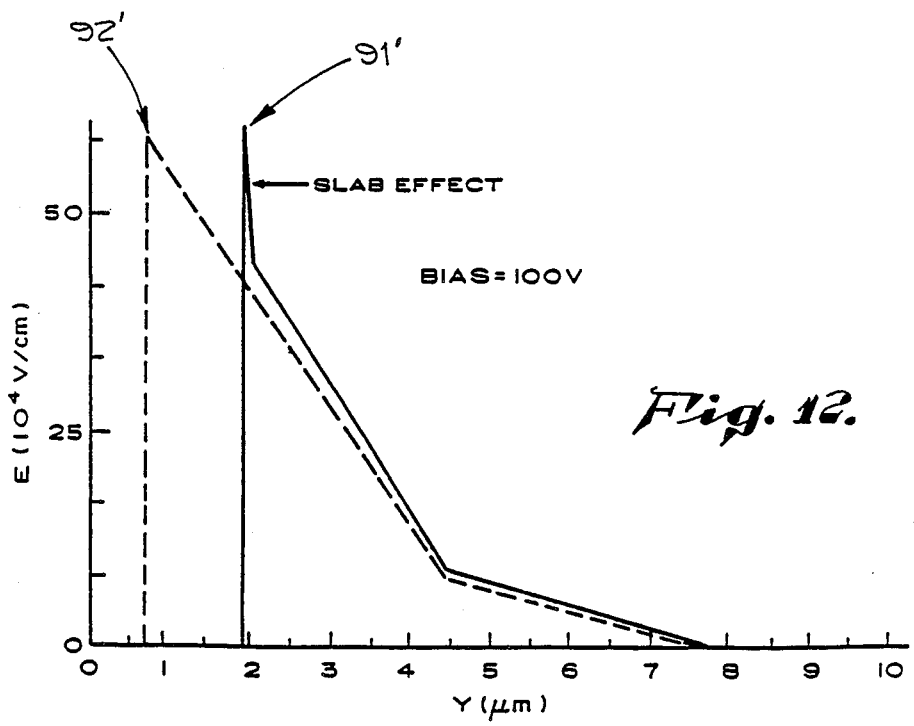
FIG. 12 shows an electric field profile in the y-axis direction of a slab avalanche photodiode, without the use of floating guard rings.

These results are easily seen in FIG. 12, where the field in the central junction region 50 is equal to, or slightly higher than the edge fields. The graphic representation of the central field 91, corresponds to a measurement taken at verticle line 91 of FIG. 11. In FIG. 12, line (92') shows a reading of the electric field taken along line 92 of FIG. 11. Here, the field at the edge 92' is shown to be equal to, or slightly higher than the edge field 91'. Thus, there is no significant edge breakdown effects in this device. This slab can be fabricated using either ion implantation, or expitaxial regrowth over a pre-etched central junction region 50. Due to the thinness, this etch and regrowth process should still result in a planar diode. The slab structure is somewhat more difficult to fabricate successfully than tee floating ring device. Like the floating ring APD, the slab guarded design conforms to all the requirements of multiplication in the absence of tunneling which are primary to the operation of SAMAPDs.

Figure 15:
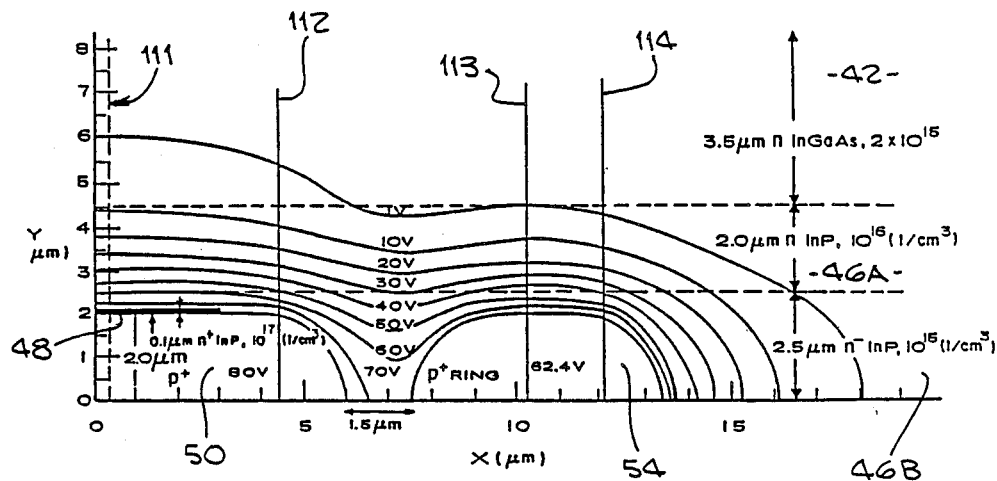
FIG. 15 shows a graphic representation of the equipotential distribution for a combined floating guard ring and slab region embodiment.
Figure 16:
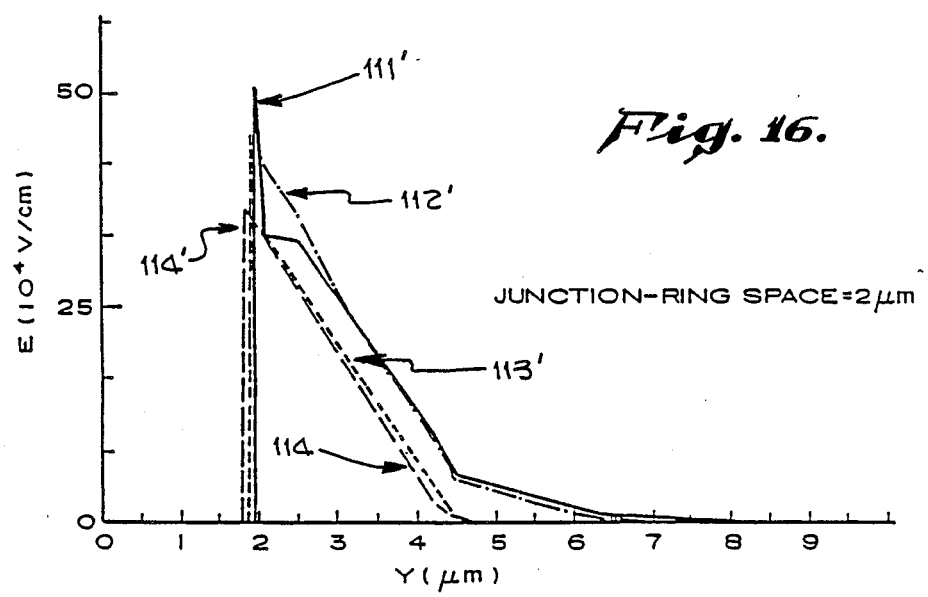
FIG. 16 shows a graphic representation of the electric field profiles for the combined floating guard ring and slab region embodiment shown in FIG. 15.

A most optimal design would be that shown at FIGS. 15 and 16 which combine the slab and floating ring concept. Where field strength readings are taken along verticle line 111, 112, 113, and 114 of FIG. 15, extending from the upper surface of the alternative embodiment APD of this invention to the interior, the overall effect of the combined structure is shown in FIG. 16. Field plots 111', 112', 113' and 114' show the results of the combined floating ring and slab design for an APD structure according to alternative embodiment of this invention.

Figure 13:
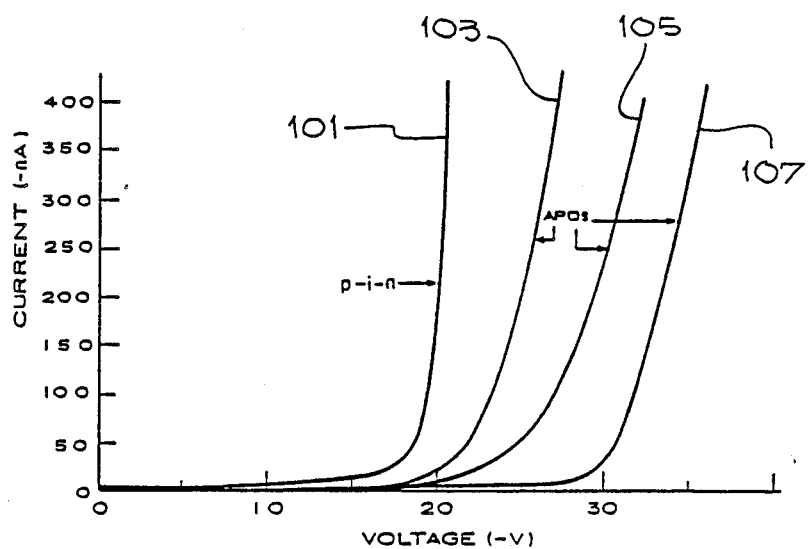
FIG. 13 shows current and voltage characteristics of the pin diode and the floating guard ring avalanche photodiode.

FIG. 13 shows a comparison between the p-i-n conventional design and the floating guard ring APD heterostructure photodiode of this invention. Curve 101 shows the voltage vs. current characteristics of a conventional p-i-n diode, while curves 103, 105, and 107, show results for the APD floating ring design of the preferred embodiment of this invention. For all these devices, the breakdown voltage across the wafer varied from that of the typical p-i-n diodes (101) of about 20 volts to a maximum of 38 volts (107) for a few diodes. Microscopic examination of the APDs indicates that devices with a low breakdown voltage had defects in the ring structure in that the rings where poorly defined or broken. Conversely, the APDs with the highest breakdown voltage had apparently flawless geometries. The nearly double breakdown voltaqe of the APD of this invention over the conventional p-i-n design is a strong indication of the usefulness of the guard rings for reducing "early" edge breakdown effects which dominate in conventional p-i-n structures.

At low voltages, about half the breakdown voltage, the dark currents of the p-i-n and APD are comparable (1 nA). There is no step increase in dark current when the depletion region "punches through" the InP layer (46 of FIG. 2) into absorption region 42, which is the characteristic of such heterostructure devices. It appears from testing that the junction effectively occurs in the absorption region for some of the devices tested, since if the junction were in the InP multiplication layer 46, breakdown voltages as high as 70 V would be expected. First experimental tests did not indicate a breakdown region right at the p-n junction. In any event, even where breakdown was shown to be near the absorption layer, the inhibiting of edge breakdown effects bought on by the isolated floating guard rings of this invention were significantly shown.

Figure 14:
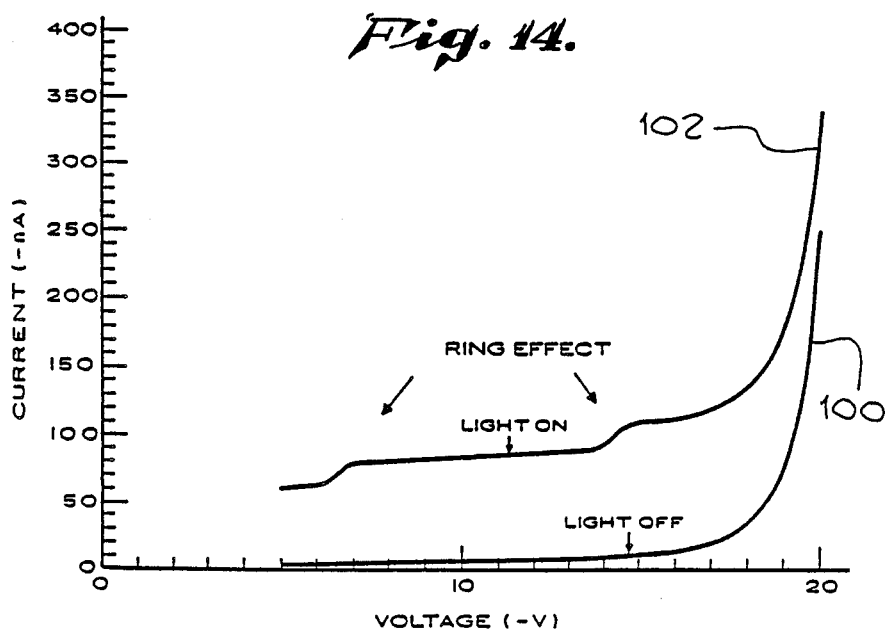
FIG. 14 shows the effect of the guard ring on the photocurrent voltage characteristics of the floating guard ring avalanche photodiode of this invention.

FIG. 14 shows the effects of the floating rings by illuminating the top surface of the APD near the center contact. A unique current voltage characteristic, with steps in photocurrent at 7 volts and 14 volts is clearly apparent. These step increases in photocurrent are attributed to an increase the photoresponse as the depletion region reaches the first and then the outer ring. Each time the depletion region touches a ring at its inner surface, it immediately penetrates to the ring outer surface, since the ring is highly p-doped, and hence forms an equipotential surface. The sudden increase in depletion region width at the diode surface increases the light collection area, thereby resulting in a related increase in photocurrent. This is shown on curve 102. Curve 100 shows the same characteristics with the light off, showing dark current normally present in the reverse bias for the photodiode.

It is also observed that some photodiodes of the preferred design exhibit highest breakdown voltages with a photocurrent step very near to the breakdown. This might be an indication that a better guard ring may be achieved with a "staggered" structure, where the distance between the rings nearest the central active region is smaller than the distance between the outer rings.

A preferred embodiment which uses both the slab and floating guard rings has been disclosed for an APD device having a heterostructure. Additional embodiments envision the use of floating guard rings at the upper planar surface of the device alone. At least one guard ring will achieve enhanced central breakdown of an avalanche nature; however, it is recommended that more than one guard ring be used where each ring is equally spaced along an outward extending x axis from the center of the photodiode. While the preferred embodiment shows such an equally spaced guard ring configuration, alternative embodiments, having rings which are spaced other than equal between each other is intended to be covered by the disclosure of this invention. Therefore, the appended claims are respectfully intended to be interpreted to the full extent allowed by law, including equivalent alternative embodiments.

What is claimed is:

1. A method of manufacturing an avalanche photodiode, comprising the steps of:
    epitaxially depositing a buffer region of a first semiconductor material over a substrate;
    epitaxially depositing a ternary absorption region of a second semiconductor material, doped with an impurity of a first conductivity type over said buffer region;
    epitaxially depositing a multiplication region, composed of said first semiconductor material and doped with an impurity of said first conductivity type except at its upper surface (where said multiplication region is doped with a low concentration of an impurity of said first conductivity type), over said ternary absorption region;
    depositing a first diffusion barrier film over said multiplication region, defining by photolithography a diffusion window using a positive resist;
    diffusing and doping said upper surface of said multiplication region with an impurity of a second conductivity type in a central region of said upper surface of the multiplication region;
    diffusing and doping a plurality of concentric rings on said upper surface surrounding said central region, said rings composed of the same material and conductivity type as said central region;
    depositing a second diffusion barrier film over said first barrier film, for protecting said upper surface of said multiplication region and confining said central region to the center of said diffusion window;
    thermally depositing a metal alloy as a conductivity contact for said central region; said contact not connected to said concentric rings;
    whereby said avalanche photodiode is complete which has an edge junction breakdown barrier to enhance the gain of said photodiode.

2. The method of manufacturing an avalanche photodiode of claim 1, including the step of:
    epitaxially depositing a speed-up region of a third semi-conductive type over said absorption region before said multiplication region is deposited.

3. The method of manufacturing an avalanche photodiode of claim 1, including:
    ion implanting a thin slab region, composed of said first semiconductor material and doped to a high concentration with an impurity of a second conductivity type, between the central region and the multiplication region;
    whereby, said photodiode as manufactured has enhanced gain in the central region.

* * * * *